(12) United States Patent
Pfirsch

(10) Patent No.: US 6,201,279 B1
(45) Date of Patent: Mar. 13, 2001

(54) SEMICONDUCTOR COMPONENT HAVING A SMALL FORWARD VOLTAGE AND HIGH BLOCKING ABILITY

(75) Inventor: Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/425,340

(22) Filed: Oct. 22, 1999

(30) Foreign Application Priority Data

Oct. 22, 1998 (DE) .............................................. 198 48 828

(51) Int. Cl.[7] ...................................................... H01L 29/78
(52) U.S. Cl. ............................ 257/333; 257/133; 257/137
(58) Field of Search .................................... 257/333, 133, 257/137

(56) References Cited

U.S. PATENT DOCUMENTS

| 4,754,310 | 6/1988 | Coe . |
| 4,941,026 | 7/1990 | Temple . |
| 5,216,275 | 6/1993 | Chen . |
| 5,723,891 | * 3/1998 | Malhi . |
| 5,780,898 | * 7/1998 | Tamaki et al. . |

OTHER PUBLICATIONS

D. Jaume et al.: "High–Voltage Planar Devices Using Field Plate and Semi–Restrictive Layers", IEEE Transactions On Electron devices, vol. 38, No. 7, Jul. 1991, pp. 1681–1684.
B. Jayant Balagi: "Modern Power Devices", John Wiley & Sons, 1987.

* cited by examiner

*Primary Examiner*—Stephen D. Meier
(74) *Attorney, Agent, or Firm*—Herbert L. Lerner; Laurence A. Greenberg; Werner H. Stemer

(57) ABSTRACT

The semiconductor component has a small forward voltage and a high blocking ability. At least one drift path suitable for taking up voltage is formed in a semiconductor body between two electrodes that are arranged at a distance from one another. At least one semi-insulating layer is provided parallel to the drift path. The semi-insulating layer leads to a linear rise in the potential between the two electrodes when a reverse voltage is applied.

16 Claims, 2 Drawing Sheets

SEMICONDUCTOR COMPONENT HAVING A SMALL FORWARD VOLTAGE AND HIGH BLOCKING ABILITY

BACKGROUND OF THE INVENTION

Field of the Invention

The invention lies in the semiconductor technology field. More specifically, the present invention relates to a semiconductor component having a small forward voltage and a high blocking ability, in which at least one drift path suitable for taking up voltage is formed in a semiconductor body between two mutually spaced-apart electrodes.

Power MOS field-effect transistors should inherently have, on the one hand, a predetermined minimum breakdown voltage, but on the other hand the highest possible conductance with regard to the area of a semiconductor body that is used for them ("silicon area"). However, the minimum breakdown voltage and the conductance are coupled with one another in the case of customary semiconductor components: high conductivity is only obtained by a high doping and/or a small thickness or drift path length, which leads, however, to a low breakdown voltage and hence to a low blocking ability. In other words, a relatively high breakdown voltage and at the same time a high conductance cannot be achieved with conventional semiconductor components. This also applies to other unipolar semiconductor components such as, for example, Schottky diodes (in this context, see B. J. Baliga: "Modern Power Devices", John Wiley & Sons, 1987, in particular Equation 6.60, FIG. 6.23 and also pages 421 ff. and 132 ff.).

In addition to the power MOSFET disclosed above, various possibilities have already been conceived of with the aim of avoiding the problem of the coupling of breakdown voltage and conductivity, so that each of these two properties can be optimized in favor of itself.

In the first instance, there are semiconductor components known as IGBTs (insulated gate bipolar transistors), which are also referred to as IGT (insulated gate transistor) or as COMFET (conductivity modulated FET). In the case of such a semiconductor component, the inherently weakly doped drift path, that is to say the "central region" which has to take up the reverse voltage, is flooded, in the case of forward-biasing, with an electron-hole plasma having a considerably higher conductivity than the weak doping of the central region (cf. B. J. Baliga, pages 350–53).

Moreover, U.S. Pat. No. 4,941,026 discloses a semiconductor component in which the electric charge contained in the drift path doping is compensated for, in the case of reverse-biasing, by charges from a gate arranged in a deep trench. In the case of such a structure, the charge in the drift path contributes to the build-up of the vertical field strength between the two electrodes only is a greatly reduced manner and, therefore, can be chosen to be considerably higher compared with customary semiconductor components. Thus, by way of example, it is possible to introduce up to twice the breakdown charge as doping in a drift path region between two trenches.

Finally, consideration has also already been given for a relatively longtime to so-called compensation components, in the case of which compensation of the drift path charge in the case of reverse-biasing of the semiconductor component is provided by means of regions arranged parallel to the drift path or zones having an opposite doping to the drift path doping (in this respect, see U.S. Pat. No. 4,754,310 and U.S. Pat. No. 5,216,275). However, in the case of those prior art semiconductor components, too, the doping of the individual regions must not exceed twice the breakdown charge ($2 \times 10^{12}$ charge carriers $cm^{-2}$ in the case of Si).

These so-called compensation components are based on mutual compensation of the charge of n- and p-doped regions in the drift path of a MOS transistor, for example. In this case, these regions are spatially arranged such that the line integral against the doping remains below the material-specific breakdown charge specified above, in other words below approximately $2 \times 10^{12}$ $cm^{-2}$ in the case of silicon. By way of example, in a vertical transistor of the kind that is customary in power electronics, p- and n-type "pillars" or "plates", etc. may be arranged in pairs. In a lateral structure, p- and n-conducting layers may be stacked alternately one above the other laterally between a trench occupied by a p-conducting layer and a trench occupied by an n-conducting layer (cf. U.S. Pat. No. 4,754,310).

The aforementioned compensation components require relatively accurate setting of the dopant concentrations in the individual zones and regions in order to actually achieve the desired compensation. This setting of the dopant concentrations has proved to be relatively difficult if, in particular, doping is intended to be performed over a relatively long period of time on different semiconductor chips.

SUMMARY OF THE INVENTION

It is accordingly an object of the invention to provide a semiconductor component having a small forward voltage and a high blocking ability, which overcomes the above-mentioned disadvantages of the heretofore-known devices and methods of this general type and which, in terms of its functionality, is independent of the variations in the process parameters which are customary in semiconductor fabrication.

With the foregoing and other objects in view there is provided, in accordance with the invention, a semiconductor component having a small forward voltage and a high blocking ability, comprising:

two mutually spaced-apart electrodes;

a semiconductor body disposed between the two electrodes and defining therein at least one drift path suitable for taking up voltage; and at least one semi-insulating layer extending parallel to the drift path.

In accordance with an added feature of the invention, the semiconductor body is of a first conductivity type and which further comprises regions of a second conductivity type, opposite the first conductivity type, formed in the semiconductor body and extending parallel to the semi-insulating layer.

Examples of material that can be used for the semi-insulating layer are semi-insulating polycrystalline silicon (SIPOS), amorphous silicon optionally doped with H (a-Si:H) or amorphous carbon optionally doped with hydrogen (a-C:H). It goes without saying that other materials having semi-insulating properties can also be used.

In accordance with a further feature of the invention, the semi-insulating layer has a defined resistivity in a range from $10^8$ to $10^{11}$ ohms cm, for instance $1 \times 10^{10}$ ohms cm.

Semi-insulating layers are known for other purposes in semiconductor technology: thus, by way of example, there are resistive field plates in the case of edge terminations with a high blocking capability which comprise SIPOS (cf. Baliga, pages 126 ff. and Jaume et al., "High-Voltage Planar Devices Using Field Plate and Semi-Resistive Layers," IEEE Transactions on Electron Devices, Vol. 38, No. 7, pp. 1681–84 (1991)).

In accordance with again an added feature of the invention, the semiconductor body is formed with a pn junction having two sides, and the semi-insulating layer is disposed adjacent at least one of the two sides.

In accordance with again an additional feature of the invention, a doping in the drift path does not exceed a breakdown charge of the component. In an exemplary embodiment, the drift path is formed of silicon and the doping in the drift path does not exceed $1 \times 10^{12}$ charge carriers $cm^{-2}$.

In the case of the semiconductor component according to the invention, by way of example, a narrow strip of a pn junction is provided with a semi-insulating layer on one or both sides. When a reverse voltage is applied to the pn junction, even a relatively low current flow through the semi-insulating layer then leads to a linear rise in the potential between the two electrodes and thus to an essentially constant electric field. In this case, the space charge zone extends over the entire depth of the drift path. However, the doping in the drift path, that is to say an n-conducting semiconductor region for example, integrated over the width of the drift path, must not exceed the breakdown charge, approximately $1 \times 10^{12}$ charge carriers $cm^{-2}$ in silicon. For two semi-insulating layers which bound a drift path, twice the specified value for the breakdown charge correspondingly applies. In the above-mentioned preferred embodiment, that breakdown charge thus does note exceed $2 \times 10^{12}$ charge carriers per square centimeter.

In the case of the semiconductor component according to the invention, countercharges to the ionized dopant atoms in the drift path are made available by the semi-insulating layer. As a result, the doping of the drift path, integrated over the depth of the drift path, can exceed the breakdown charge by a multiple without adversely affecting the blocking ability of the pn junction.

In accordance with again another feature of the invention, the semi-insulating layer is arranged between the two electrodes.

In accordance with yet a further feature of the invention, the semiconductor body is n-doped.

In accordance with a preferred embodiment of the invention, regions of a second conductivity type are provided parallel to the semi-insulating layer in a semiconductor body of the first conductivity type, opposite the second conductivity type. In other words, the compensation of the above-mentioned drift path charge is employed, in which case, however, the compensation of the charges is automatically established by way of the current flow in the semi-insulating layer in the case of the semiconductor component according to the invention, which considerably reduces the requirements imposed on the accuracy of the doping concentration in the individual layers.

In other words, by virtue of the so-called "composite buffer layer" technique, in which, by way of example, p-conducting "pillars" are embedded in an n-conducting semiconductor region of a drift path, the majority of the charge required for compensation purposes can be made available in these p-conducting pillars. The exact compensation is then effected, however, by the additional semi-insulating layers.

Such a procedure affords particular advantages: on the one hand, the high accuracy is not required in the case of the doping of the p-conducting pillars; on the other hand, however, the countercharge required in the semi-insulating layers is small, which makes the charge-reversal current flowing during switching operations in the semi-insulating layer small and reduces the charge-reversal time.

In accordance with a concomitant feature of the invention, there are provided a multiplicity of mutually parallel drift paths in the semiconductor body.

The semiconductor component according to the invention may advantageously be a power MOSFET such as, by way of example, a planar DMOS field-effect transistor or a trench DMOS field-effect transistor, a Schottky diode, a junction field-effect transistor (JFET), etc.

Other features which are considered as characteristic for the invention are set forth in the appended claims.

Although the invention is illustrated and described herein as embodied in a semiconductor component having a small forward voltage and a high blocking ability, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a potential profile in the case of reverse voltage in the semiconductor component of FIG. 1a;

FIG. 1c is a profile of the electric field in the case of reverse voltage in the semiconductor component of FIG. 1a;

FIG. 1d is a diagrammatic view of a space charge distribution in the case of reverse voltage in the semiconductor component of FIG. 1a;

Mutually corresponding structural parts are each identified with the same reference symbols throughout the figures. Moreover, in the figures that show sectional illustrations (FIG. 1a, FIG. 1b, and FIGS. 2 to 8), not all the sectioned surfaces are hatched, in order to afford better clarity.

DESCRIPTION OF THE PREFERRED EMBODIMENTS

Figure 1A:
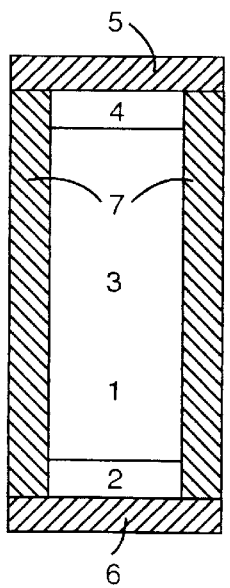
FIG. 1a is a diagrammatic view of a basic structure of a semiconductor component according to the invention.

Referring now to the figures of the drawing in detail and first, particularly, to FIG. 1a thereof, there is seen a basic structure of the semiconductor component according to the invention. The component has a semiconductor body 1 made of an n+-conducting semiconductor substrate 2, an n-conducting semiconductor layer 3 provided on the latter, a p-conducting semiconductor layer 4, which forms a pn junction with the semiconductor layer 3, electrodes 5 and 6, and also semi-insulating layers made of SIPOS, for example. The semi-insulating layers 7 extend between the two electrodes 5, 6 on both sides of the pn junction.

It shall be noted that in this example, as in the following exemplary embodiments, the conductivity types can also be reversed in each case. In other words, the semiconductor body 1 may also comprise a p+-conducting semiconductor substrate 2 and a p-conducting semiconductor layer 3, on which an n-conducting semiconductor layer 4 is then provided.

Figure 1B:
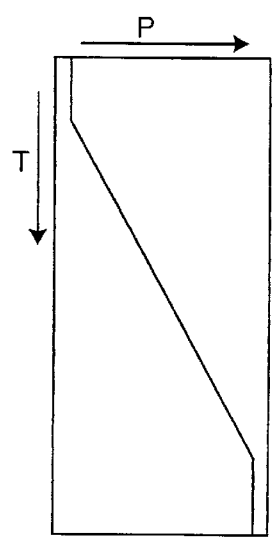
Figure 1C:
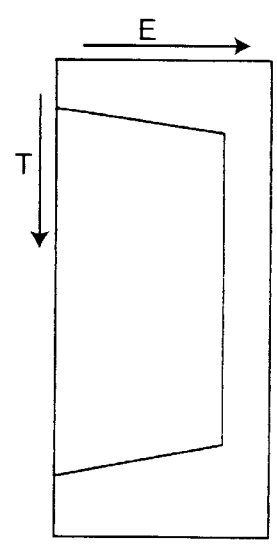

In the case of the semiconductor component according to the invention, then, a narrow strip of the pn junction is provided with the semi-insulating layer 7 on one or alternatively (as illustrated) on both sides. When a reverse voltage is applied between the electrodes 5 and 6 across the pn junction between the layers 3 and 4, a small current flow through the semi-insulating layers 7 then leads to a linear rise in a potential P between the electrodes 5, 6 as a function of a depth T, as is shown in FIG. 1(b). This results in an essentially constant profile of the electric field E, as can be seen from FIG. 1(c).

Figure 1D:
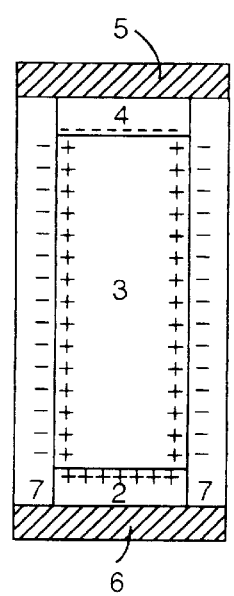

In this case, the space charge zone extends over the entire depth T of the n-conducting layer 3, provided that the doping of this n-conducting layer 3, integrated over the width thereof, does not exceed the breakdown charge, that is to say approximately $1 \times 10^{12}$ cm$^{-2}$ in the case of silicon. In this case, the countercharges to the ionized dopant atoms in the n-conducting layer 3 are made available by the semi-insulating layers 7, as is indicated diagrammatically in FIG. 1(d).

Thus, it is possible for the doping of the n-conducting layer 3, integrated over the depth T of the n-conducting layer 3, to exceed the breakdown charge by a multiple without adversely affecting the blocking ability of the pn junction with respect to the layer 4.

Various concrete exemplary embodiments of the semiconductor component according to the invention will now be explained with reference to FIGS. 2 to 8.

Figure 2:
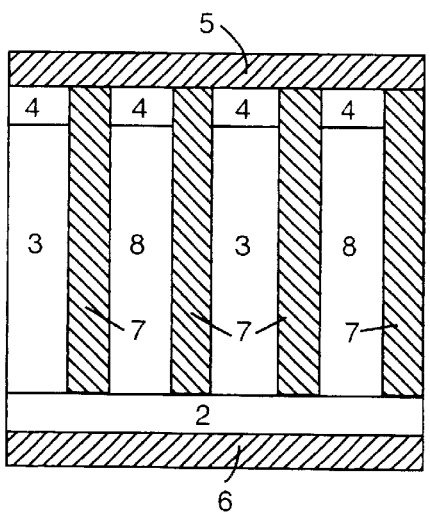
FIG. 2 is a section taken through a first exemplary embodiment of the semiconductor component according to the invention with only approximately mutually compensating n- and p-conducting regions in the drift path.

FIG. 2 shows a first exemplary embodiment, in which, in addition to the basic structure of FIG. 1, p-conducting "pillars" 8 are also provided and the semi-insulating layers 7 made of SIPOS already terminate at the n+-conducting silicon semiconductor substrate 2. These p-conducting pillars 8 provide the majority of the electric charge required for compensation purposes, with the result that the exact compensation can be ensured by the additional semi-insulating layers 7. As a result of this, on the one hand, a high accuracy is not required in the doping of the p-conducting pillars 8, and, on the other hand, the countercharge required in the semi-insulating layers 7 is small, which leads to a reduction in the space charge current flowing during switching operations in the semi-insulating layers 7 and hence to a reduction in the charge-reversal time.

Figure 3:
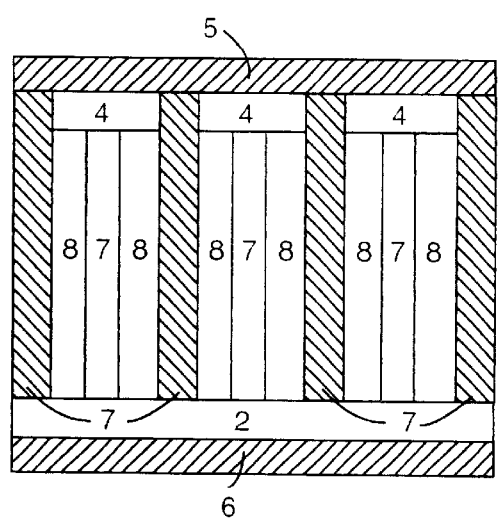
FIG. 3 is a section take through a second exemplary embodiment of the semiconductor component according to the invention with only approximately mutually compensating n- and p-conducting regions in the drift path.

FIG. 3 shows a modification of the exemplary embodiment of FIG. 2, where a plurality of p-conducting pillars 8 are respectively inserted between semi-insulating layers 7 in this case.

One essential advantage of the semiconductor component according to the invention is that it is possible to avoid accurately setting the doping in the p-conducting pillars 8 for compensation of the charges owing to the fact that this compensation of the charges is effected by means of the semi-insulating layers 7, which provide the required charges in a self-aligned manner as a result of the linear resistive voltage drop.

Figure 4:
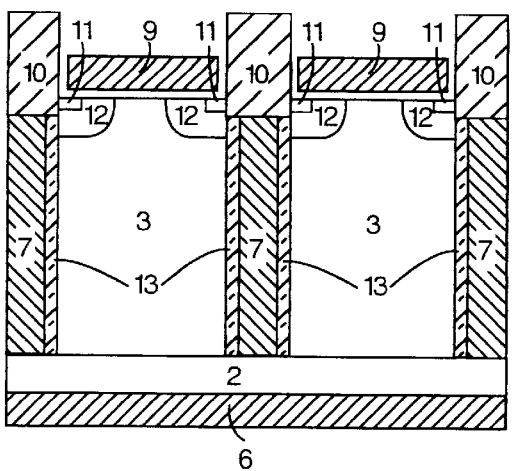
FIG. 4 is a section taken through a third exemplary embodiment of the semiconductor component according to the invention with a planar DMOS transistor having semi-insulating layers isolated from the semiconductor material by silicon dioxide.
Figure 5:
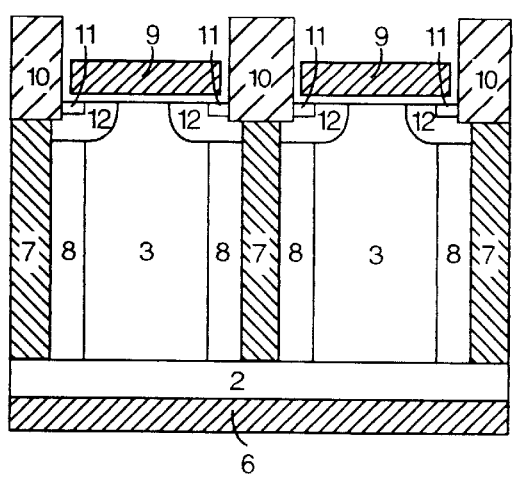
FIG. 5 is a section taken through a fourth exemplary embodiment of the semiconductor component according to the invention with a planar DMOS transistor having approximately mutually compensating n- and p-conducting regions in the drift path.

FIGS. 4 and 5 show two further exemplary embodiments of the semiconductor component according to the invention with reference to a vertical DMOS field-effect transistor having a planar gate electrode 9, a source or body electrode 10, an n+-conducting source zone 11, a p-conducting body or channel region 12 and insulating layers 13 which are each composed of silicon dioxide and/or silicon nitride and are provided between the n-conducting semiconductor layers 3 and the semi-insulating layers 7. What is essential, however, is that in the exemplary embodiment of FIG. 4, there is contact between the semi-insulating layers 7 and the respective layers or electrodes that are at reverse-biasing potential, that is to say the source electrode 10 and respectively, via the n+-conducting silicon semiconductor substrate 2, the drain electrode 6.

FIG. 5 shows an exemplary embodiment which is modified with respect to that of FIG. 4, where, instead of the insulating layers 13, the so-called "composite buffer layer" technique with p-conducting pillars 8 is again employed in this case.

It shall also be noted that in the exemplary embodiments of FIGS. 4 and 5, the gate electrodes 9 are embedded in a customary manner in an insulating layer made, for example, of silicon dioxide and/or silicon nitride. By way of example, polycrystalline silicon can be used for the gate electrodes 9, while the source electrodes 10 and the drain electrode 6 may be composed of aluminum for example.

Figure 6:
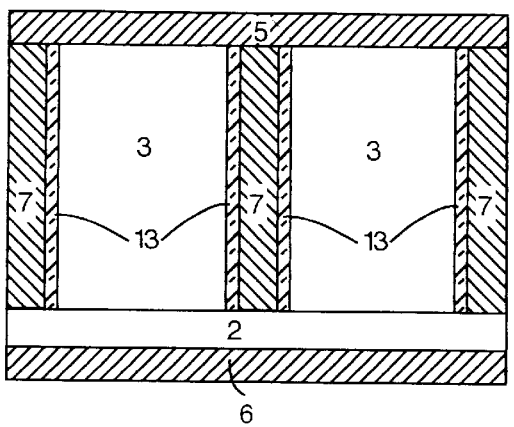
FIG. 6 is a section taken through a fifth exemplary embodiment of the semiconductor component according to the invention with a Schottky diode having semi-insulating layers isolated from the semiconductor material by silicon dioxide.
Figure 7:
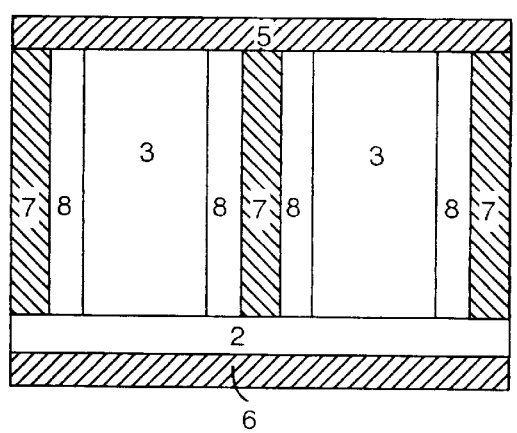
FIG. 7 is a section taken through a sixth exemplary embodiment of the semiconductor component according to the invention with a Schottky diode having approximately mutually compensating n- and p-conducting regions in the drift path.
Figure 8:
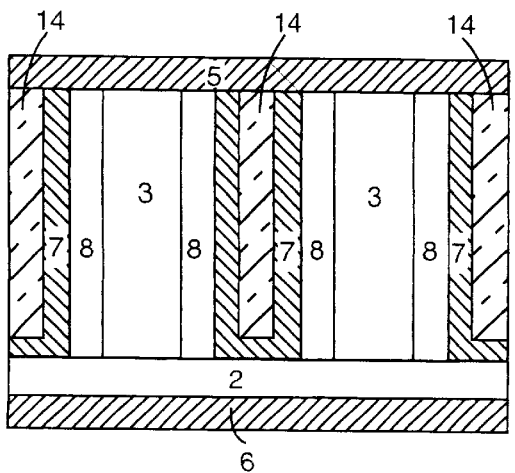
FIG. 8 is a section taken through a seventh exemplary embodiment of the semiconductor component according to the invention with a Schottky diode having approximately mutually compensating n- and p-conducting regions in the drift path and a filling of trenches etched during the fabrication with silicon dioxide.

FIGS. 6 to 8 show further exemplary embodiments of the semiconductor component according to the invention with reference to a Schottky diode, in which the electrodes 15 form a Schottky contact on the anode side with the n-conducting semiconductor layer 3 and, in a similar manner to that in the exemplary embodiment of FIG. 4, insulating layers 13 are provided between the semi-insulating layers 7 and the semiconductor layers 3.

FIG. 7 shows a modification of the exemplary embodiment of FIG. 6, where in this case, in a similar manner to that in the exemplary embodiment of FIG. 5 but now in the case of a Schottky diode -,p-conducting pillars 8 are additionally present for compensation purposes.

In the exemplary embodiment of FIG. 8, in contrast to the exemplary embodiment of FIG. 7, an insulating layer 14 made of silicon dioxide, for example, is additionally "filled" into a semi-insulating layer 7. Such a configuration may be advantageous if relatively wide trenches are introduced into the n-conducting semiconductor layer 3 in order first of all to produce the p-conducting pillars from said trenches by means of diffusion and then to fill these trenches with SIPOS, for example, at their edge. The remainder of the trenches can be closed by means of silicon dioxide 14, for example.

Although exemplary embodiments configured in a vertical structure have been explained, the present invention can readily be applied to lateral structures as well. Moreover, as has already been mentioned, instead of the preferably used SIPOS, it is also possible to use a different semi-insulating material. The insulating layers 13 surrounding the semi-insulating layers 7 can, if appropriate, also be omitted.

The semi-insulating layers 7 can be produced in a relatively simple manner. By way of example, SIPOS can be deposited in a similar manner to polycrystalline silicon.

Preferred layer thicknesses (that is to say, for example, from "left" to "right" in FIG. 1(a) lie in the range from 1 to 10 μm for the n-conducting layers, while the semi-insulating layers 7, likewise in the same direction, may have a layer thickness of from 0.1 to 2 μm.

The resistivity of the semi-insulating layers should be in the region of approximately $1 \times 10^{10}$ ohm cm, although values vastly different from this are also possible. Resistivity values in the range from $10^8$ to $10^{11}$ ohms cm are at any rate suitable.

I claim:

1. A semiconductor component having a small forward voltage and a high blocking ability, comprising:

two mutually spaced-apart electrodes;

a semiconductor body disposed between said two electrodes and defining therein at least one drift path suitable for taking up voltage; and at least one semi-insulating layer extending parallel to said drift path.

2. The semiconductor component according to claim 1, wherein said semiconductor body is of a first conductivity type and which further comprises regions of a second conductivity type, opposite the first conductivity type, formed in said semiconductor body and extending parallel to said semi-insulating layer.

3. The semiconductor component according to claim 1, wherein said semi-insulating layer is composed of a material selected from the group consisting of semi-insulating polycrystalline silicon, amorphous silicon, and amorphous carbon.

4. The semiconductor component according to claim 1, wherein said semi-insulating layer is composed of a material selected from the group consisting of amorphous silicon and amorphous carbon doped with hydrogen.

5. The semiconductor component according to claim 1, wherein said semi-insulating layer has a defined resistivity in a range from $10^8$ to $10^{11}$ ohms cm.

6. The semiconductor component according to claim 1, wherein said semiconductor body is formed with a pn junction having two sides, and said semi-insulating layer is disposed adjacent at least one of said two sides.

7. The semiconductor component according to claim 1, wherein a doping in said drift path does not exceed a breakdown charge of the component.

8. The semiconductor component according to claim 7, wherein said drift path is formed of silicon and the doping in said drift path does not exceed $1 \times 10^{12}$ charge carriers $cm^{-2}$.

9. The semiconductor component according to claim 1, wherein the at least one semi-insulating layer is one of two semi-insulating layers disposed on both sides of said semiconductor body, and a doping in said drift path does not exceed twice a breakdown charge.

10. The semiconductor component according to claim 9, wherein said drift path is formed of silicon and the doping in said drift path does not exceed $2 \times 10^{12}$ charge carriers $cm^{-2}$.

11. The semiconductor component according to claim 1, wherein said semi-insulating layer is arranged between said two electrodes.

12. The semiconductor component according to claim 1, wherein said semiconductor body is n-doped.

13. The semiconductor component according to claim 1, wherein said drift path is one of a multiplicity of mutually parallel drift paths formed in said semiconductor body.

14. The semiconductor component according to claim 1, wherein said electrodes, said semiconductor body, and said semi-insulating layer define a power MOSFET.

15. The semiconductor component according to claim 1, wherein said electrodes, said semiconductor body, and said semi-insulating layer define a Schottky diode.

16. The semiconductor component according to claim 1, wherein said electrodes, said semiconductor body, and said semi-insulating layer define a junction field-effect transistor.

* * * * *